United States Patent
Tanaka et al.

(10) Patent No.: US 10,757,850 B2
(45) Date of Patent: Aug. 25, 2020

(54) TAPE FEEDER AND COMPONENT MOUNTER

(71) Applicant: FUJI CORPORATION, Chiryu-shi (JP)

(72) Inventors: Keita Tanaka, Takahama (JP); Junro Takakuwa, Toyohashi (JP)

(73) Assignee: FUJI CORPORATION, Chiryu-shi (JP)

( * ) Notice: Subject to any disclaimer, the term of this patent is extended or adjusted under 35 U.S.C. 154(b) by 7 days.

(21) Appl. No.: 16/064,078

(22) PCT Filed: Dec. 21, 2015

(86) PCT No.: PCT/JP2015/085725
§ 371 (c)(1),
(2) Date: Jun. 20, 2018

(87) PCT Pub. No.: WO2017/109840
PCT Pub. Date: Jun. 29, 2017

(65) Prior Publication Data
US 2018/0376629 A1    Dec. 27, 2018

(51) Int. Cl.
*H05K 13/02* (2006.01)
*H05K 13/04* (2006.01)
(Continued)

(52) U.S. Cl.
CPC ............ *H05K 13/02* (2013.01); *B65H 20/22* (2013.01); *G01D 5/145* (2013.01);
(Continued)

(58) Field of Classification Search
CPC .... H05K 13/02; H05K 13/0419; H05K 13/08; H05K 13/082; H05K 13/086; H05K 13/089; B65H 20/22; B65H 2553/51
See application file for complete search history.

(56) References Cited

U.S. PATENT DOCUMENTS 6,269,860 B1 *  8/2001  Ishikawa ............ H05K 13/0417
156/750

FOREIGN PATENT DOCUMENTS

CN        1929732 A        3/2007
EP     2 022 303 A1       2/2009
(Continued)

OTHER PUBLICATIONS

Machine Translation of JP 2007-073632 A, Mar. 22, 2007. (Year: 2007).*

(Continued)

*Primary Examiner* — William E Dondero
(74) *Attorney, Agent, or Firm* — Oblon, McClelland, Maier & Neustadt, L.L.P.

(57) ABSTRACT

A tape feeder includes a magnet that rotates as one with a sprocket driven by a motor, two magnetic field detecting elements that detect signals in accordance with a magnetic field from the magnet and that are arranged at positions opposite the rotation region of the magnet, and a rotation angle detecting circuit that detects the rotation angle of the magnet and the rotation angle of the sprocket by processing output signals of the magnetic field detecting elements. A control section of the tape feeder reads the detection information of the rotation angle detecting circuit from immediately after the motor is started, recognizes the rotation angle of the sprocket, detects the position of tooth of the sprocket of the tooth engaged with a feeding hole of component supply tape based on the recognition results of the rotation angle of the sprocket for each pitch feeding operation of the sprocket, and corrects the pitch feeding amount of the motor by a pitch error correcting amount set for the tooth.

6 Claims, 3 Drawing Sheets

(51) Int. Cl.
  *B65H 20/22*    (2006.01)
  *H05K 13/08*    (2006.01)
  *G01D 5/14*     (2006.01)
(52) U.S. Cl.
  CPC ....... *H05K 13/0419* (2018.08); *H05K 13/082* (2018.08); *H05K 13/086* (2018.08); *H05K 13/089* (2018.08); *B65H 2553/51* (2013.01)

(56) References Cited

FOREIGN PATENT DOCUMENTS

| | | |
|---|---|---|
| JP | 2007-059654 A | 3/2007 |
| JP | 2007-073632 A | 3/2007 |
| JP | 2009-135549 A | 6/2009 |
| JP | 2010-287698 A | 12/2010 |
| KR | 10-2015-0081067 | 7/2015 |

OTHER PUBLICATIONS

International Search Report dated Mar. 29, 2016 in PCT/JP2015/085725, filed on Dec. 21, 2015.

* cited by examiner

TAPE FEEDER AND COMPONENT MOUNTER

TECHNICAL FIELD

The present application relates to a tape feeder and component mounter equipped with a functions for correcting an error in a pitch feeding amount of each tooth of a sprocket that feeds component supply tape by a specified pitch each time.

BACKGROUND ART

For example, as disclosed in patent literature 1 (JP-A-2009-135549), in a tape feeder, because an error arises in a pitch feeding amount of each tooth of a sprocket that pitch feeds component supply tape due to factors such as assembly variations or manufacturing variations of the sprocket, the error in the pitch feeding amount of each tooth of the sprocket causes the component inside the component supply tape to deviate from a component pickup position during each pitch feeding operation, thus leading to component pickup errors.

As a countermeasure to this problem, in patent literature 1, in an adjustment process of the tape feeder, the tape feeder is set on an adjustment jig, the sprocket is rotated by one pitch at a time, the tooth above a rotation center of the sprocket (the tooth that engages with a feeding hole of the component supply tape) is imaged from above using a camera, image recognition processing is performed on the image to recognize the position of the tooth (tooth number), such processing being performed for all teeth; further, the position data of each tooth is stored on non-volatile memory inside the tape feeder, then, the tape feeder is set on the component mounter, and when component pickup operation is performed, the position data of each tooth stored in the memory of the tape feeder is referenced, and the component pickup position is corrected in accordance with the error in the pitch feeding amount for each tooth of the sprocket, thus preventing component pickup errors.

CITATION LIST

Patent Literature

Patent literature 1: JP-A-2009-135549

BRIEF SUMMARY

Technical Problem

However, to correct the error in the pitch feeding amount of each tooth of the sprocket, it is necessary to recognize which tooth position (rotation angle) on the sprocket is the tooth that is the target for correction, therefore it is necessary to accurately detect the rotation angle from a reference angle of the sprocket (that is, an absolute rotation angle).

For this, conventionally, rotation of the motor and the sprocket is synchronized, and a regularly occurring encoder pulse is counted, with the count value of the encoder pulse being reset each time the sprocket completes one rotation (360 degrees) from the reference angle, thus, by linking the count value of the encoder pulse to the rotation angle of the sprocket from the reference angle, it is possible to detect the rotation angle of the sprocket from the reference angle based on the count value of the encoder pulse.

However, with such a configuration, after starting the motor (after turning on the power), for the period until the sprocket is rotated such that the reference angle is detected (which may be until the sprocket is rotated by a maximum of one rotation), the rotation angle of the sprocket from the reference angle is unknown, and the position of a tooth of the sprocket (tooth number) cannot be recognized; therefore, the error in the pitch feeding amount of each tooth of the sprocket cannot be corrected, leading to the possibility of component pickup errors and unstable component pickup orientations. This causes component pickup rates to be lower immediately after the motor is started, leading to lower productivity, and lower quality and component mounting accuracy due to unstable component pickup orientations.

Thus, an object of the present disclosure is to solve the above problems by preventing component pickup errors and unstable component pickup orientations caused by an error in the pitch feeding amount of each tooth of a sprocket immediately after a motor that drives the sprocket is started (immediately after the power is turned on).

Solution to Problem

To solve the above problems, the present disclosure is a tape feeder including: a sprocket with teeth, the teeth engaging with feeding holes of component supply tape in which many components are arranged at a specified pitch, and the sprocket being rotated by a motor such that the component supply tape is fed intermittently by the specified pitch so that the components in the component supply tape can be picked up one by one by a suction nozzle of a component mounter; a magnetic member configured to rotate together with the sprocket; a magnetic field detecting element arranged at a position facing a rotation region of the magnetic member and configured to output a signal in accordance with a magnetic field of the magnetic member; a rotation angle detecting means configured to process the output signal of the magnetic field detecting element to detect a rotation degree of the sprocket in terms of an absolute angle; and a control means configured to control pitch feeding operation of the sprocket by the motor, the control means correcting the pitch feeding amount of the motor based on the rotation angle of the sprocket detected by the rotation angle detecting means for each pitch feeding operation of the sprocket immediately after the motor is started.

With this configuration, it is possible to detect the rotation angle of the sprocket using the rotation angle detecting means even immediately after the motor is started (immediately after the power is turned on), therefore it is possible to correct the pitch feeding amount based on the rotation angle of the sprocket from the first pitch feeding operation immediately after the motor is started. Accordingly, it is possible to position the first component in the component supply tape with good accuracy at the component pickup position for each pitch feeding operation of the sprocket immediately after the motor is started, which prevents component pickup errors from immediately after the motor is started and stabilizes the component pickup orientation. As a result, the component pickup rate immediately after the motor is started is improved, thus improving productivity and improving component mounting accuracy and quality by stabilizing the component pickup orientation immediately after the motor is started. Further, if for some reason correct pitch feeding operation is not performed and the rotation angle of each pitch feeding operation of the sprocket deviates from the range due to the manufacturing variance, it is possible to correct the pitch feeding amount of the motor such that the rotation angle of each pitch feeding operation of the sprocket is within the range due to the manufacturing variance, based on the detection value of the rotation angle detecting means, thereby improving the accuracy and reliability of the pitch feeding operation.

Specifically, the control means may be configured to correct the pitch feeding amount of the motor by a pitch error correcting amount set for each tooth after detecting a tooth position on the sprocket of the tooth engaged with the feeding hole of the component supply tape, based on the rotation angle of the sprocket detected by the rotation angle detecting means for each pitch feeding operation of the sprocket immediately after the motor is started. With this configuration, it is possible to correct with good accuracy the pitch feeding amount for each tooth of the sprocket from immediately after the motor is started.

Also, in the magnetic member, at least one pair of an N pole and an S pole may be positioned opposite each other around a rotation center of the sprocket, multiple of the magnetic field detecting elements may be arranged separated from each other by a specified angle in a rotation direction of the sprocket, and the rotation angle detecting means may detect the rotation angle of the sprocket by processing the output signals of the multiple magnetic field detecting elements. With this configuration, it is possible to detect with good accuracy the rotation angle of the sprocket by combining output signals of multiple magnetic field detecting elements.

Note that, as the gears of the rotation transmission mechanism that transmits rotation of the motor to the sprocket wear, even if the motor rotates correctly, it is possible that the rotation angle of each pitch feeding operation of the sprocket will not fall within the range of the manufacturing variance.

Thus, the control means may determine whether checking of the rotation state of the sprocket is required based on the rotation angle of the sprocket detected by the rotation angle detecting means. With this configuration, if for some reason the rotation angle of each pitch feeding operation is not within the range of the manufacturing variance, and it is necessary to check the rotation state of the sprocket, that fact can be detected at an early stage, thus preventing the sprocket from continuing to be used while in a state in which checking the rotation state is required.

In this case, the control means may report to an operator when it is determined that it is necessary to check the rotation state of the sprocket. Reporting to the operator may be performed using a display or sound at a display device of the component mounter or the like, or by displaying on a display section of a mobile terminal used by the operator. Thus, the operator can be prompted to check the rotation state of the sprocket at an early stage.

The prevent disclosure is not limited to the above configuration that corrects the pitch feeding amount of each tooth of a sprocket, and a control means of the component mounter may correct the component pickup position in accordance with the error in the pitch feeding amount of each tooth of the sprocket. Specifically, the configuration may be such that the detection information of the rotation angle detecting means is sent from the control means of the tape feeder to the control means of the component mounter, and the control means of the component mounter may recognize the rotation angle of the sprocket based on the detection information of the rotation angle detecting means sent from the control means of the tape feeder for each pitch feeding operation of the sprocket from immediately after the motor of the tape feeder is started, correct the component pickup position accordingly, and then pick up the component in the component supply tape at the corrected component pickup position using a suction nozzle. With this configuration, it is possible to reduce or eliminate the deviation between the component pickup position and the stopping position of the first component in the component supply tape for each pitch feeding operation of the sprocket immediately after the motor is started, which prevents component pickup errors from immediately after the motor is started and stabilizes the component pickup orientation.

Specifically, the control means of the component mounter may detect a tooth position on the sprocket of the tooth engaged with the feeding hole of the component supply tape and correct the component pickup position by a component pickup position correction amount set for each tooth by recognizing the rotation angle of the sprocket based on the detection information of the rotation angle detecting means sent from the control means of the tape feeder for each pitch feeding operation of the sprocket immediately after the motor is started, and then pick up the component inside the component supply tape using the suction nozzle at the corrected component pickup position.

DESCRIPTION OF EMBODIMENTS

Descriptions of two embodiments for carrying out the present disclosure are given below.

First Embodiment

Figure 1:
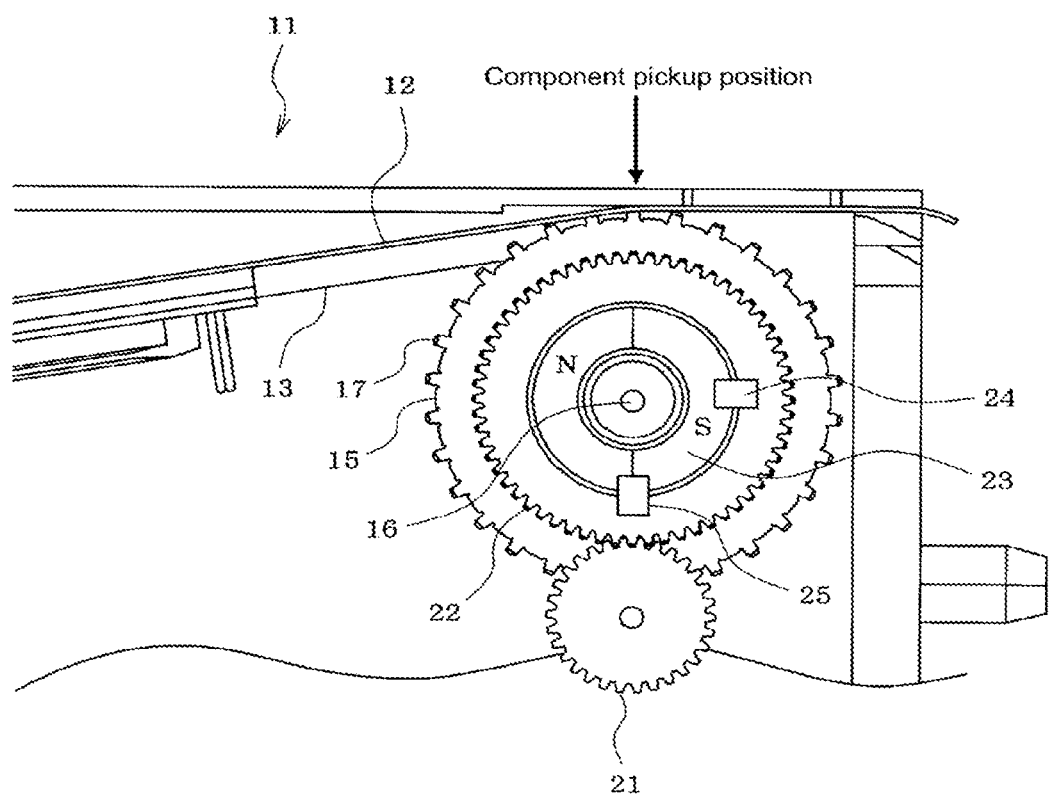
FIG. 1 is a front view showing the configuration of a sprocket of a tape feeder and surrounding portions in a first embodiment of the present disclosure.
Figure 2:
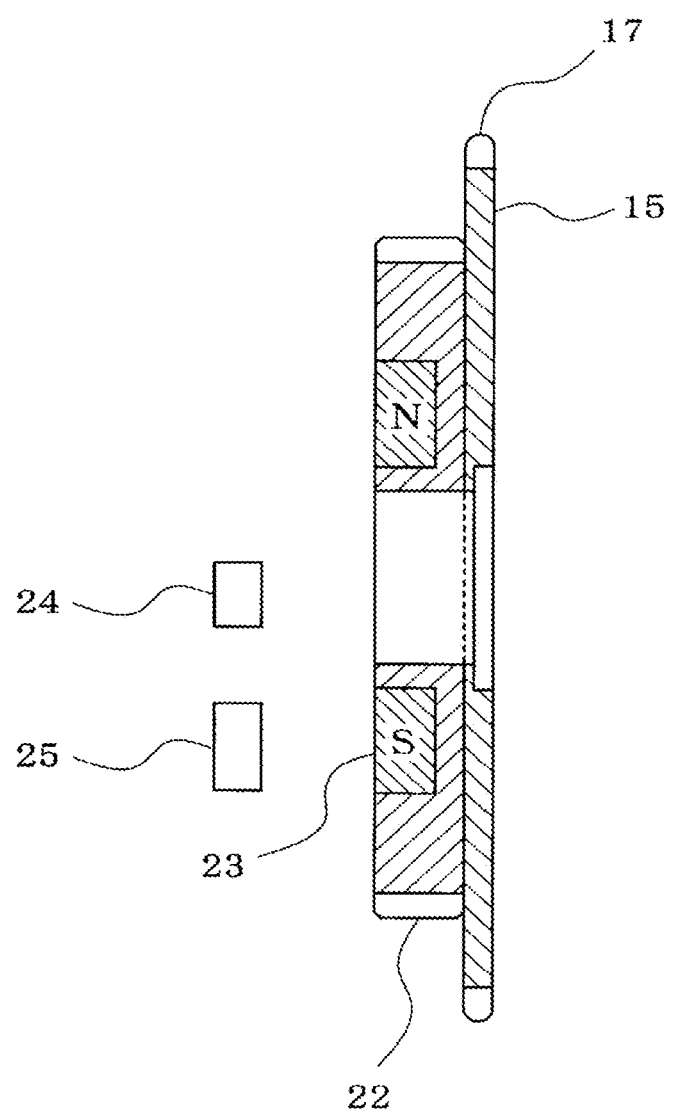
FIG. 2 is a cross section showing the configuration of a sensor portion that detects the rotation angle of the sprocket.

A first embodiment of the present disclosure will be described based on FIGS. 1 to 3. First, the configuration of tape feeder 11 is described. A reel (not shown) around which is wound component supply tape 12 is exchangeably set on tape feeder 11, and the component supply tape 12 pulled from the reel is guided by tape guide 13 to a component pickup position at the upper surface on the front end of the tape feeder 11. Note that, although not shown, component supply tape 12 is formed from cover tape (also known as top tape) adhered to an upper surface of carrier tape in which many components are arranged at a specified pitch, and the cover tape on the upper surface of component supply tape 12 is peeled from the carrier tape in front of the component pickup position to reveal the components inside the tape, such that the components inside component supply tape 12 can be picked up by a suction nozzle (not shown) of component mounter 14 at the component pickup position.

Sprocket 15 that pitch feeds component supply tape 12 is rotatably supported via rotation shaft 16 below the component pickup position. Teeth 17 are formed on the outer circumference of sprockets 15 at a specified pitch, and component supply tape 12 is pitch fed by using motor 19 (refer to FIG. 3) to rotate sprocket 15 with the teeth 17 of sprocket 15 engaged with feeding holes (not shown) formed at a specified pitch along one edge of the component supply tape 12. By consecutively feeding component supply tape 12 by the arrangement pitch of the components in component supply tape 12 by performing one pitch feeding operation, components inside component supply tape 12 are fed one by one to the component pickup position for each pitch feeding operation.

Multiple gears, 21 and 22, of a rotation transmission mechanism that transmits rotation of motor 19 to sprocket 15 at a specified gear ratio are arranged between sprocket 15 and motor 19, and one of the gears, gear 22, is concentrically fixed to a side surface of sprocket 15. Further, ring-shaped magnet 23 (magnetic member) is concentrically fixed to the inner circumference of gear 22, which is on the side surface of sprocket 15, such that sprocket 15, gear 22, and magnet 23 rotate as one. Magnet 23 is configured with a pair of poles, a north pole and a south pole, magnetized at a 180 degree pitch and attached at positions opposite each other around the rotational center of sprocket 15.

Two magnetic field detecting elements, 24 and 25, are arranged separated from each other by a specified angle (for example, 90 degrees) on a circumference centered around the rotational center of magnet 23 at positions opposite to the rotating region of magnet 23. Magnetic field detecting elements 24 and 25 are mounted on a circuit board (not shown) and are fixed to the main body of tape feeder 11. Each of the magnetic field detecting elements 24 and 25 detects signals in accordance with the strength and direction of the magnetic field from magnet 23, and may be configured from, for example, a Hall element (Hall IC), a magneto resistive element (MR element), a magnetic diode, a magnetic transistor, a magnetic thyristor, or a TMR element.

Figure 3:
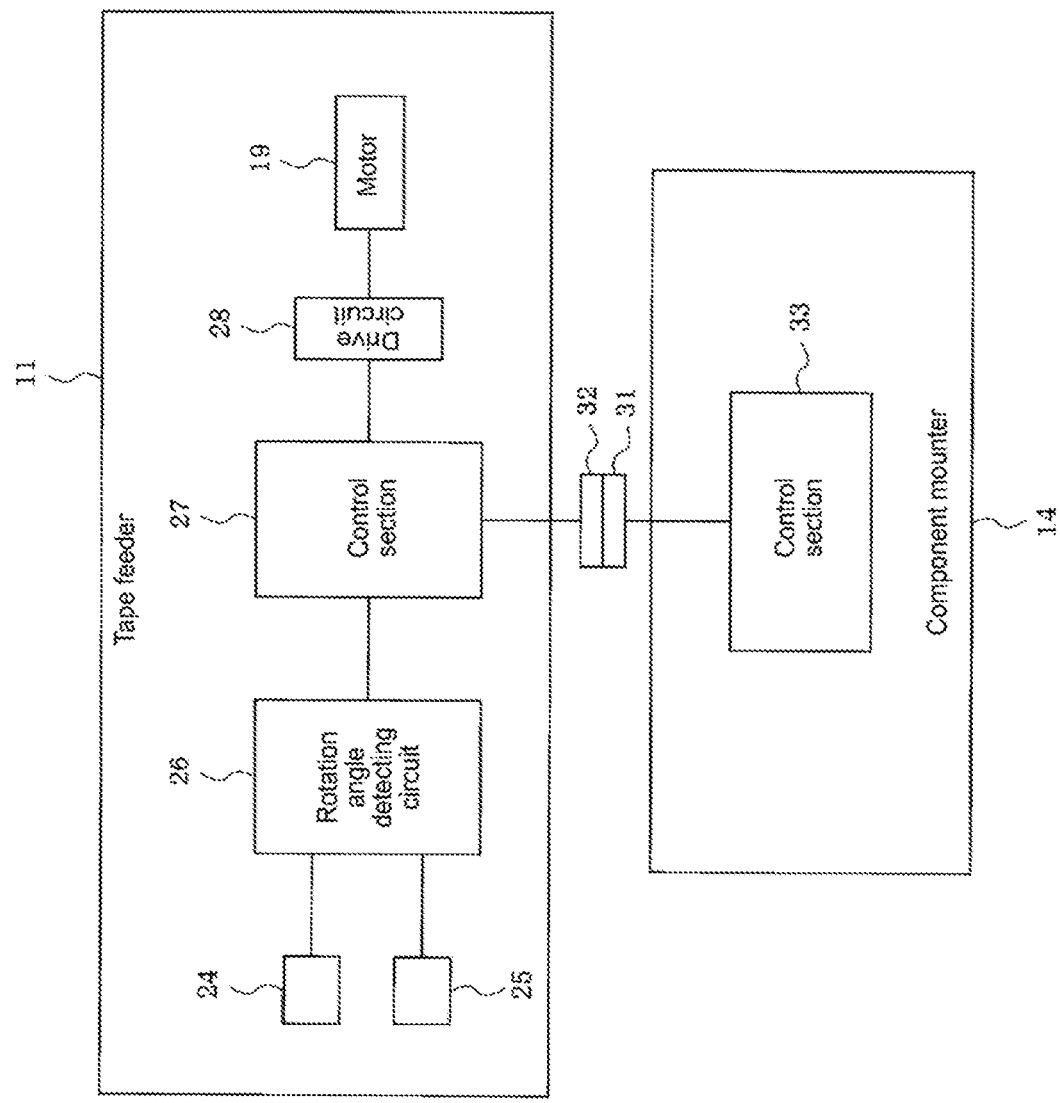
FIG. 3 is a block diagram showing the configuration of control items of the tape feeder.

As shown in FIG. 3, the output signals of magnetic field detecting elements 24 and 25 are received by rotation angle detecting circuit 26 (rotation angle detecting means), and are processed by rotation angle detecting circuit 26 to detect the rotation angle of magnet 23 and the rotation angle of sprocket 15 in terms of an absolute angle, with this detection information then received by control section 27 of tape feeder 11.

Control section 27 of tape feeder 11 is configured around a microcomputer, and functions as a control means that controls pitch feeding operation of sprocket 15 by outputting control signals to drive circuit 28 for each pitch feeding operation of sprocket 15 so as to drive motor 19. Further, control section 27 of tape feeder 11 reads the detection information of rotation angle detecting circuit 26 from immediately after motor 19 is started, recognizes the rotation angle (absolute angle) of sprocket 15, detects the position of tooth 17 (tooth number) of sprocket 15 of the tooth engaged with a feeding hole of component supply tape 12 based on the recognition results of the rotation angle of sprocket 15 for each pitch feeding operation of sprocket 15, and corrects the pitch feeding amount of motor 19 by a pitch error correcting amount set for the tooth 17. The pitch error correcting amount of each tooth 17 of sprocket 15 may be measured in advance during an adjustment process of tape feeder 11, and memorized on non-volatile memory (not shown) inside tape feeder 11.

Power-and-signal-use connector 32 that connects to power-and-signal-use connector 31 on the component mounter 14 side is provided on tape feeder 11, and by setting tape feeder 11 on a feeder setting table (not shown) of component mounter 14, power-and signal-use connector 32 of tape feeder 11 is connected to power-and-signal-use connector 31 on the component mounter 14 side, such that power is supplied to tape feeder 11 from the component mounter 14 side and such that signals can be sent and received between control section 27 of tape feeder 11 and control section 33 of component mounter 14.

Note that, as gears 21 and 22 of the rotation transmission mechanism that transmits rotation of motor 19 to sprocket 15 wear, even if motor 19 rotates correctly, it is possible that the rotation angle of each pitch feeding operation of sprocket 15 will not fall within the range of the manufacturing variance.

Thus, with the first embodiment, control section 27 of tape feeder 11 may determine whether checking of the rotation state of sprocket 15 is required based on the rotation angle of sprocket 15 detected by rotation angle detecting circuit 26 for each pitch feeding operation. This determination, for example, may determine whether the rotation angle of sprocket 15 detected by rotation angle detecting circuit 26 for each pitch feeding operation deviates from a specified angle range (for example, a manufacturing variance range, or a range slightly wider than that), and if the rotation angle is deviated from the specified angle range, may determine that checking of the rotation state of sprocket 15 is required, and may report to an operator to prompt them to perform such checking. Reporting to the operator may be performed using a display or sound at a display device (not shown) of component mounter 14 or the like, or by displaying on a display section of a mobile terminal used by the operator. With this configuration, if for some reason the rotation angle of each pitch feeding operation of sprocket 15 is not within the range of the manufacturing variance, and it is necessary to check the rotation state of sprocket 15, that fact can be detected at an early stage, and an operator can be prompted to check the rotation state of sprocket 15 at an early stage, thus preventing sprocket 15 from continuing to be used while in a state in which checking the rotation state is required.

Alternatively, control section 27 of tape feeder 11 may determine whether the rotation angle of sprocket 15 detected by rotation angle detecting circuit 26 for each pitch feeding operation deviates from the specified angle range (for example, a manufacturing variance range, or a range slightly wider than that), and if the rotation angle is deviated from the specified angle range, may determine that correction of the pitch feeding amount of motor 19 is required, and may correct the pitch feeding amount of motor 19 such that the rotation angle of each pitch feeding operation of sprocket 15 is within the specified angle range. With this configuration, if for some reason correct pitch feeding operation is not performed and the rotation angle of each pitch feeding operation of sprocket 15 deviates from the specified angle range, it is possible to correct the pitch feeding amount of motor 19 such that the rotation angle of each pitch feeding operation of sprocket 15 is within the specified angle range, based on the rotation angle of sprocket 15 detected by rotation angle detecting circuit 26, thereby improving the accuracy and reliability of the pitch feeding operation.

According to the first embodiment described above, it is possible to detect the rotation angle (absolute angle) of sprocket 15 using rotation angle detecting circuit 26 even immediately after motor 19 of tape feeder 11 is started (immediately after the power is turned on), therefore it is possible to correct the pitch feeding amount based on the rotation angle of sprocket 15 from the first pitch feeding operation immediately after motor 19 is started. Accordingly, it is possible to position the first component in component supply tape 12 with good accuracy at the component pickup position for each pitch feeding operation of sprocket 15 immediately after motor 19 is started, which prevents component pickup errors from immediately after motor 19 is started and stabilizes the component pickup orientation. As a result, the component pickup rate immediately after motor 19 is started is improved, thus improving productivity and improving component mounting accuracy and quality by stabilizing the component pickup orientation immediately after motor 19 is started.

Second Embodiment

Next, a second embodiment of the present disclosure will be described. However, for portions which are effectively the same as in the first embodiment, the same symbols will be assigned and descriptions will be omitted or simplified, with descriptions mainly being given for portions that are different.

In the first embodiment above, the pitch feeding amount for each tooth 17 of sprocket 15 is corrected based on the rotation angle of sprocket 15 detected by rotation angle detecting circuit 26 for each pitch feeding operation of sprocket 15 of tape feeder 11, but in the second embodiment, control section 33 of component mounter 14 corrects the component pickup position in accordance with an error in the pitch feeding amount for each tooth 17 of sprocket 15 of tape feeder 11.

With the second embodiment, control section 27 of tape feeder 11 may send detection information of rotation angle detecting circuit 26 to control section 33 of component mounter 14, and control section 33 of component mounter 14 may detect a position (tooth number) of tooth 17 on sprocket 15 of the tooth engaged with the feeding hole of component supply tape 12 and correct the component pickup position by a component pickup position correction amount set for each tooth by recognizing the rotation angle of the sprocket 15 based on the detection information of rotation angle detecting circuit 26 sent from control section 27 of tape feeder 11 for each pitch feeding operation of sprocket 15 immediately after motor 19 of tape feeder 11 is started, and then pick up the component inside component supply tape 12 using the suction nozzle at the corrected component pickup position. In this case, the component pickup position correction amount for each tooth 17 of sprocket 15 is set to match the predetermined error in the pitch feeding amount of each tooth 17, and is memorized on non-volatile memory (not shown) of component mounter 14.

With the second embodiment described above, it is possible to reduce or eliminate the deviation between the component pickup position and the stopping position of the first component in component supply tape 12 for each pitch feeding operation of sprocket 15 immediately after the motor of tape feeder 11 is started, which prevents component pickup errors from immediately after motor 19 of tape feeder 11 is started and stabilizes the component pickup orientation.

Note that, in the first and second embodiments, two magnetic field detecting elements, 24 and 25, that detect a magnetic field of magnet 23 that rotates as one with sprocket 15 are arranged, but three or more magnetic field detecting elements may be arranged. Also, the quantity of N and S poles of magnet 23 may be changed, and the magnetization pattern may be changed.

In addition, the present disclosure is not limited to the first and second embodiments described above and it goes without saying that various embodiments with changes that do not extend beyond the scope of the disclosure are possible, such as that suitable changes may be made to the configuration of tape feeder 11.

REFERENCE SIGNS LIST

11: tape feeder; 12: component supply tape; 14: component mounter, 15: sprocket; 17: tooth; 19: motor, 21, 22: gear, 23: magnet (magnetic member); 24, 25: magnetic field detecting element; 26: rotation angle detecting circuit (rotation angle detecting means); 27: tape feeder control section (control means); 33: component mounter control section (control means)

The invention claimed is:

1. A tape feeder comprising:
a sprocket with teeth, the teeth engaging with feeding holes of component supply tape in which many components are arranged at a specified pitch;
a gear concentrically fixed to a side surface of the sprocket;
a motor that transmits rotation to the gear such that the component supply tape is fed intermittently by the specified pitch so that the components in the component supply tape can be picked up one by one by a suction nozzle of a component mounter;
a magnetic member concentrically fixed to an inner circumference of the gear and configured to rotate together with the sprocket;
a magnetic field detecting element arranged at a position facing a rotation region of the magnetic member on a side of the gear opposite to the sprocket and configured to output a signal in accordance with a magnetic field of the magnetic member;
a rotation angle detecting circuit configured to process the output signal of the magnetic field detecting element to detect a rotation degree of the sprocket in terms of an absolute angle; and
a control section including circuitry configured to control pitch feeding operation of the sprocket by the motor, the control section correcting the pitch feeding amount of the motor based on the rotation angle of the sprocket detected by the rotation angle detecting circuit for each pitch feeding operation of the sprocket immediately after the motor is started, and when the rotation angle of the sprocket detected by the rotation angle detecting circuit is deviated from a predetermined sprocket angle range the pitch feeding amount is corrected such that the rotation angle of each pitch feeding operation of sprocket is within the predetermined sprocket angle range.

2. The tape feeder according to claim 1, wherein
the control section is configured to correct the pitch feeding amount of the motor by a pitch error correcting amount set for each tooth after detecting a tooth position on the sprocket of the tooth engaged with the feeding hole of the component supply tape, based on the rotation angle of the sprocket detected by the rotation angle detecting circuit for each pitch feeding operation of the sprocket immediately after the motor is started.

3. The tape feeder according to claim 1, wherein
in the magnetic member, at least one pair of an N pole and an S pole are positioned opposite each other around a rotation center of the gear,
multiple of the magnetic field detecting elements are arranged separated from each other by a specified angle in a rotation direction of the sprocket, and
the rotation angle detecting circuit detects the rotation angle of the sprocket by processing the output signals of the multiple magnetic field detecting elements.

4. The tape feeder according to claim 1, wherein
the control section is configured to determine whether checking of the rotation state of the sprocket is required based on the rotation angle of the sprocket detected by the rotation angle detecting circuit.

5. The tape feeder according to claim 4, wherein
the control section is configured to report to an operator when it is determined that it is necessary to check the rotation state of the sprocket.
6. The tape feeder according to claim 1, wherein
the predetermined sprocket angle range is a manufacturing variance range of the sprocket.

\* \* \* \* \*